US006927644B2

United States Patent
Toncich

(10) Patent No.: US 6,927,644 B2
(45) Date of Patent: Aug. 9, 2005

(54) LOW-LOSS TUNABLE FERRO-ELECTRIC DEVICE AND METHOD OF CHARACTERIZATION

(75) Inventor: Stanley S. Toncich, San Diego, CA (US)

(73) Assignee: Kyocera Wireless Corp., San Diego, CA (US)

( * ) Notice: Subject to any disclaimer, the term of this patent is extended or adjusted under 35 U.S.C. 154(b) by 0 days.

(21) Appl. No.: 10/750,304

(22) Filed: Dec. 31, 2003

(65) Prior Publication Data

US 2004/0155731 A1 Aug. 12, 2004

Related U.S. Application Data

(62) Division of application No. 09/927,732, filed on Aug. 8, 2001, now Pat. No. 6,690,176.
(60) Provisional application No. 60/283,093, filed on Apr. 11, 2001.

(51) Int. Cl.$^7$ .............................................. H01L 29/93
(52) U.S. Cl. ...................... 333/24 C; 333/105; 257/595
(58) Field of Search ................................ 333/202, 205, 333/219, 235; 257/595

(56) References Cited

U.S. PATENT DOCUMENTS 6,525,630 B1 * 2/2003 Zhu et al. .................... 333/205
6,727,535 B1 * 4/2004 Sengupta et al. ........... 257/295

* cited by examiner

Primary Examiner—Dean Takaoka

(57) ABSTRACT

A tunable ferroelectric component and a narrowband resonant circuit for measuring the loss of the ferroelectric component. The ferroelectric component may be a capacitor integrated in the resonant circuit. The testing method eliminates other sources of loss to isolate the loss due to the ferroelectric material and to demonstrate that this loss is low.

19 Claims, 6 Drawing Sheets

| KWC SAMPLE # | NRL SAMPLE # | NRL CAPACITOR (pF) | NRL Q (0 VDC) | KWC CAP (pF) | KWC Q (0 VDC) | KWC Q (40 VDC) | $f_o$ (MHz) | TUNING (MHz/V) | COMMENTS |
|---|---|---|---|---|---|---|---|---|---|
| 01 | NRL # 1-A | 1.012 | 10.1 | 0.99 | 190 | | 1622 | ~1.0 | |
| 02 | NRL # 1-A | 1.012 | 10.1 | 0.96 | 183 | | 1605 | ~1.0 | |
| 01 | NRL # 3-A | 1.004 | 10.1 | 0.90 | 101 | 123 | 1610 | ~1.0 | |
| 02 | NRL # 2-A | 0.76 | 10.2 | 0.75 | 200 | | 1900 | ~0.5 | |
| 06 | NRL # 2-A | 0.76 | 10.2 | 0.72 | 205 | | | ~0.5 | DAMAGED, HIGH V |
| 05 | NRL # 2-A | 0.76 | 10.2 | 0.71 | 196 | 200 | 1912 | ~0.5 | |

PLANAR REALIZATION OF SINGLE RESONATOR BPF.
CAN BE REALIZED WITHOUT VIA'S USING GROUND PLANES
& A WILTRON TEST FIXTURE.

EXAMPLE OPERATING PARAMETERS

| Temperature (degrees C) | Frequency (GHz) |
|---|---|
| Example 1: -50 to 100 | Example 1: 0.25 to 7.0 |
| Quality Factor (Q) | Example 2: 0.8 to 7.0 |
| Example 1: > 80 | Example 3: 0.25 to 2.5 |
| Example 2: > 180 | Example 4: 0.8 to 2.5 |
| Capacitance (pF) | |
| Example 1: 0.3 to 3.0 | |
| Example 2: 0.5 to 1.0 | |
| Example 3: 0.8 to 1.5 | |

LOW-LOSS TUNABLE FERRO-ELECTRIC DEVICE AND METHOD OF CHARACTERIZATION

RELATED APPLICATIONS

This is a divisional of U.S. application Ser. No. 09/927,732, filed Aug. 8, 2001 now U.S. Pat. No. 6,690,176, which claims the benefit U.S. Provisional Application 60/283,093, filed Apr. 11, 2001, which is hereby incorporated by reference. Additionally, this application relates to U.S. application Ser. No. 09/904,631. "Tunable Ferro-electric Filter," filed on Jul. 13, 2001, and U.S. application Ser. No. 09/912,753. "Tunable Ferro-electric Multiplexer," filed on Jul. 24, 2001, which are hereby incorporated by reference.

FIELD OF THE INVENTION

The field of the present invention is ferro-electric tunable electronic devices and components.

BACKGROUND OF THE INVENTION

Variable capacitors are advantageous as different electronic responses can be obtained by variation of the capacitance. The structures presently used to implement variable or tunable capacitors, however, have significant performance and practical limitations. Movable parallel plates, while providing variable capacitance for radio tuning, are bulky, lossy, noisy, generally operate over only a limited range of frequencies, or have any number of these limitations. A "lossy" component or device has a high insertion loss (IL), which is the ratio of power dissipated in the component to power delivered to a load. An electronic varactor is a semiconductor device that adjusts capacitance responsive to an applied voltage. Varactors are typically lossy and noisy, and are therefore generally ineffective for high-frequency applications, particularly those above 200 MHz. Hence, they are not suited for tuning insertion loss-critical devices such as filters and multiplexers in wireless applications, particularly where Code Division Multiple Access (CDMA) is used. Another implementation providing variable capacitance is a micro-electro-mechanical system (MEMS). This is a miniature switching device that physically selects a different capacitor responsive to an applied signal. MEMS, however, is typically costly, unreliable, requires a substantial control voltage, and enables only a discrete set of pre-selected capacitance values.

Because of their variable dielectric constant, ferroelectric materials are good candidates for making tunable capacitors or other tunable components. Under presently used measurement and characterization techniques, however, tunable ferroelectric components have gained the reputation of being consistently and substantially lossy, regardless of the processing, doping or other fabrication techniques used to improve their loss properties. They have therefore not been widely used. Ferroelectric tunable components operating in RF or microwave regions are perceived as being particularly lossy. This observation is supported by experience in RADAR applications where, for example, high RF or microwave loss is the conventional rule for bulk (thickness greater than about 1.0 mm) f-e materials especially when maximum tuning is desired. In general, most f-e materials are lossy unless steps are taken to improve (reduce) their loss. Such steps include, but are not limited to: (1) pre and post deposition annealing or both to compensate for $O_2$ vacancies, (2) use of buffer layers to reduce surfaces stresses, (3) alloying or buffering with other materials and (4) selective doping.

As demand for limited range tuning of lower power components has increased in recent years, the interest in ferroelectric materials has turned to the use of thin film rather than bulk materials. The assumption of high ferroelectric loss, however, has carried over into thin film work as well. Conventional broadband measurement techniques have bolstered the assumption that tunable ferroelectric components, whether bulk or thin film, have substantial loss.

A broadband measurement of the capacitance value of a ferroelectric capacitor is typically obtained using a device such as an LRC meter, impedance analyzer or a network analyzer. From power measurements, one can calculate the lossiness of the capacitor. The inverse of lossiness is referred to as the Quality Factor ("Q"). Thus, a lossy device will have a low Q and a more efficient device will have a high Q. Q measurements for ferroelectric capacitors with capacitances in the range of about 0.5 pF to 1.0 pF operating in a frequency range of 1.8 GHz to 2.0 GHz, obtained using conventional measurement techniques, are typically claimed to be in the range of 10–50. This is unacceptably inefficient, and ferroelectric tunable components are therefore considered undesirable for widespread use. In wireless communications, for example, a Q of greater than 80, and preferably greater than 180, and more preferably greater than 350, is necessary at frequencies of about 2 GHz.

As will be shown below, conventional ferroelectric components have been wrongly fabricated, measured and characterized. As a result, it is commonly assumed that ferroelectric tunable components are very lossy with Qs in the range of 10–50 in the L-band. Ferroelectric tunable devices operating in other frequency bands have also been labeled as having Qs unacceptable for most applications.

SUMMARY OF THE INVENTION

The methods of testing the loss, or its inverse, Q, of f-e films are flawed in the prior art. The prior art methods typically use broadband testing methods and non-integrated components. All of the loss mechanisms of the testing methods and devices under test are typically not accounted for. This has led investigators to believe that f-e materials are lossy.

The invention provides for narrowband testing methods and integration of components. All loss mechanisms are accounted for and eliminated or minimized. This results in more accurate test results, showing that some f-e materials are much less lossy than previously thought.

With this testing method, f-e materials can be successfully investigated to find ideal tradeoffs between loss, tunability and other parameters. Low loss tunable f-e devices can be built. A low loss, f-e tunable capacitor can be built. Such a capacitor can be used as a building block in many applications where tunability is desired, but low loss requirements had been preventing the use of any other tunable devices. An example application is in wireless communication devices.

BRIEF DESCRIPTION OF THE DRAWINGS

The details of the present invention, both as to its structure and operation, may be gleaned in part by study of the accompanying drawings, in which like reference numerals refer to like parts, and in which:

FIG. 10b is a planar realization of the circuit schematic of FIG. 10a.

DETAILED DESCRIPTION OF THE INVENTION

Figure 1:
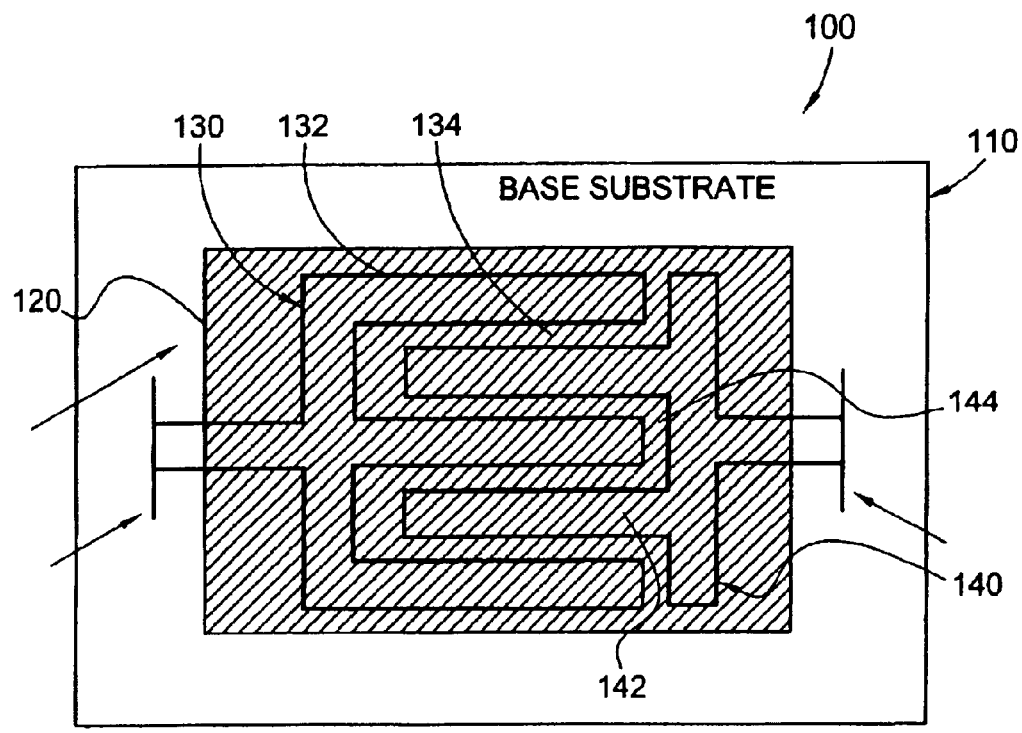
FIG. 1 is a top view of an interdigital capacitor fabricated with a thin ferroelectric film.

The present invention provides test methods utilizing narrowband resonant circuits that accurately measure and characterize the efficiency of tunable ferroelectric components in the frequency range in which they will be used, and with topologies that will be used. These test methods and circuits establish that tunable ferroelectric components are not as uniformly lossy as previously thought and that they may advantageously be used in low-loss applications and devices, such as wireless handsets. With an accurate determination of loss, tunable ferroelectric components can be properly optimized and designed. Specific loss mechanisms can be identified and eliminated, or otherwise reduced and bounded.

Tunable ferroelectric components, especially those using thin films, can be employed in a wide variety of frequency agile circuits. Tunable components are desirable because they can provide smaller component size and height, lower insertion loss or better rejection for the same insertion loss, lower cost and the ability to tune over more than one frequency band. The ability of a tunable component that can cover multiple bands potentially reduces the number of necessary components, such as switches that would be necessary to select between discrete bands were multiple fixed frequency components used. These advantages are particularly important in wireless handset design, where the need for increased functionality and lower cost and size are seemingly contradictory requirements. In CDMA handsets, for example, performance of individual components is highly stressed. Ferroelectric materials may also permit integration of RF components that to-date have resisted shrinkage, such as an antenna interface unit (AIU) for a wireless device.

For example, an AIU could integrate one or more tunable duplexers (US PCS and cellular in a dual band wireless communication device), diplexers, PA's and LNA's. Some or all of these components could be advantageously integrated, their total size or volume or both being reduced and their electronic performance improved. Further applications for tunable ferroelectric components are set forth in the latter portion of this specification.

As with any dielectric, ferroelectric material has two primary loss mechanisms, conductivity loss and damping from lattice vibrations in the dielectric. The combination of the two effects is referred to as the material's loss tangent $(\tan(\delta))$. For ferroelectric materials considered in tunable RF or microwave circuits, damping from lattice vibrations dominate, as there are no free charge carriers. However, any method which measures $\tan(\delta)$ will include effects of finite conductivity if present. This is because the loss effects of the two mechanisms are indistinguishable as far as rf/microwave properties are concerned.

A primary component in RF circuits is the capacitor. F-E tunability will now be discussed in terms of f-e capacitors. The total loss of a capacitor, whether tunable or not, is given by its quality factor (Q) which is expressed as a ratio of its stored to dissipated energy, where the energy is stored in the electric field and dissipated in resistance. For a lumped element capacitor, the unloaded Q ($Q_u$) is given by:

$$Q_u = X/R_s = 1/((\omega^* R_s^* C) \tag{1}$$

where $\omega$=radian frequency; $R_s$=the series resistance of the capacitor; and C=the capacitance of the capacitor. $R_s$ is measured and given that C and $\omega$ are known, $Q_u$ can be calculated. The series resistance arises from both the conductor and dissipative loss in the dielectric, i.e. $\tan(\delta)$.

If a tunable capacitor is integrated into a resonant circuit, the total Q ($Q_t$) of the system is now given by:

$$1/Q_t = 1/Q_c + 1/Q_d + 1/Q_r \tag{2}$$

where $Q_c$ is the conductor Q; $Q_d$ is the dielectric Q and $Q_r$ is the radiation Q. For a well designed non-radiating system, there is no radiation loss. Hence, the conductor loss and the dielectric loss determine the total loss. The dielectric loss is the effect of the loss tangent, $\tan(\delta)$, including conductivity loss attributable to the dielectric, if the latter loss is present. Hence, for both the unloaded Q and the total Q, a correct measurement of $\tan(\delta)$ is crucial in determining whether a tunable device can be fabricated with acceptable loss characteristics.

Cavity resonator methods are conventionally used to measure a material's dielectric constant and loss tangent. These methods are difficult, especially at lower microwave frequencies (~2 GHz) where cellular phones operate, as the size of the cavity is quite large. Use of cavity resonator methods on thin ferroelectric films poses a greater problem, as it is very difficult to measure the perturbation introduced to a cavity from a structure having a thickness in the range of one micron. The potential for error is significant.

Because of this difficulty with resonator methods, interdigital capacitors (IDC's) are usually used to measure ferroelectric film quality. A ferroelectric interdigital capacitor (IDC) 100 in a conventional microstrip configuration is depicted in FIG. 1. Interdigital capacitor 100 comprises base substrate 110; thin film ferroelectric layer 120; and first and second conductors 130 and 140. Interdigital capacitors are typically used in applications such as monolithic microwave integrated circuits (MMICs) and in applications where small footprints and capacitances in the range of 0.1–6 pF are needed. In an interdigital capacitor, the capacitance is created between conductive parallel lines or fingers in the structure.

Base substrate 110 typically comprises a low loss material such as magnesium oxide (MgO), sapphire or high purity aluminum, for example. The substrate is chosen based on its inherent low loss tangent and its ability to accept the direct deposition of a wide range of f-e films without additional buffer layers. A thin ferroelectric film 120 is deposited on base substrate 110. Ferroelectric film 120 typically has a thickness in the range of 0.15–1.5 microns. A conductive layer is then deposited onto ferroelectric film 120. Sometimes an adhesion layer is needed. The conductive layer is preferably a metallic material such as copper, gold or silver. These metals are advantageous due to their relatively low loss at room temperature. For purposes of this specification, room temperature is defined as being in the range from −30° C. to +85° C. which covers the typical operating temperature range for most commercial components. The conductive layer typically has a thickness in the range of 0.5 to 6.0 microns, with a thickness in the range of 0.5 to 1.5 microns being most common. Thickness requirements vary based on skin depth which varies based on frequency.

While thin film ($t_{f\text{-}e}$ less than about 1.5 $\mu$m) f-e materials have been discussed, thick film f-e material can be used as well. Here, "thick film" is defined to be $t_{f\text{-}e}$ greater than about 1.5 $\mu$m and less than about 1.0 mm. Bulk is greater than about 1.0 mm. The fabrication and application of thick film f-e material is quite different than that of thin film f-e material. It usually involves a paste or a sol-gel technique, and the f-e materials to produce the significantly added thickness. The added thickness and especially reduced cost comes at the price of somewhat degraded f-e performance, notably, reduced tunability.

Interdigital capacitor 100 is then fabricated using either etch-back or lift-off techniques to form first conductor 130 and second conductor 140. First conductor 130 has fingers 132 and spaces 134 that are proximate fingers 142 and spaces 144 of second conductor 140. The conductors are arranged so that fingers 132 of first conductor 130 are in spaces 144 of second conductor 140, and so that fingers 142 of second conductor 140 are in spaces 134 of first conductor 130. To date, most researchers and other practitioners in f-e film fabrication and characterization have designed IDC's with fingers typically 1–5 microns wide, and the gap or space between the fingers typically 1–5 microns wide.

The capacitance is created primarily between fingers 132 and 142. To generate a high level of capacitance, small gap size (<5 microns) and long fingers are required. When used as a ferroelectric tuning capacitor, small gap size also assists in creating a large tuning field between the fingers. This is critical because much of the tuning field is lost in the air region above capacitor 100.

The greatest loss component in this configuration is in the odd mode generated in the finger region. The coupling between the parallel lines can be expressed in terms of an even mode and an odd mode. The even mode occurs when both lines are excited in phase (usually taken to be zero), and the odd mode occurs when the lines are excited 180 degrees out of phase. In microstrip circuits, the velocities at which the even and odd modes propagate are different. The loss further increases when a thin conductive layer (less than 1.5 microns), narrow finger width and gap spacing (either or both less than 5 microns) and sharp corners are used.

The standard procedure for measuring thin ferroelectric film loss via an interdigital capacitor is as follows. As described above, approximately 0.5 microns of ferroelectric film is deposited on a low loss substrate such as magnesium oxide. Then, a conductive layer having a thickness of 1 micron or less is deposited to permit fabrication of an interdigital capacitor of the smallest possible size. Finger width and gap spacing are both typically in the 1 to 5 $\mu$m range. Etch-back or lift-back techniques are used to form narrow, long fingers with sharp corners. The resulting interdigital capacitor is characterized using a broadband measurement tool such as an LRC meter or an impedance or network analyzer with probe tips that contact the capacitor.

Using this procedure, capacitors in the range of 0.2 to 1.5 pF are obtained, with Q's in the range of 10–100 at an operating frequency of anywhere from approximately 500 MHz to approximately 2 GHz is typically measured. This loss is typically attributed entirely to the ferroelectric film. These Q values are considered quite low and, consequently, ferroelectric tunable components are commonly assumed to be high loss and unacceptable for many uses. In wireless communications, for example, a Q of greater than 100 and preferably greater than 250 is necessary at frequencies in the range of 2 GHz for f-e capacitors in the vicinity of 1.0 pF. As will be described below, however, conventional fabrication and loss measurement techniques do not yield a reliable indication of the actual loss attributable to the ferroelectric film.

As indicated in Equation (1), capacitor loss (whether tunable or not) is proportional to the series loss $R_s$ at radio frequency (f>about 500 MHz) where the effect of the large parallel resistance that shunts the capacitance is negligible. The capacitor does not care what the source of the series loss is, only that there is a source. For example, for a 1 pF ferroelectric tunable capacitor to have an acceptably low loss ($Q_u$=250) at 2 GHz, the series loss must be only 0.32Ω. The series loss includes the total loss from all sources arising from the capacitor's use. In order to minimize or eliminate the sources of series loss, one must first account for each loss mechanism that is present. This will permit a more accurate determination of the loss attributable specifically to the ferroelectric film.

For f-e devices, the total loss is governed by summing each source contribution as follows:

$$L_t = L_{geom} + L_{attach} + L_{metal} + L_{sub} + L_{rad} + L_{meas} + L_{f\text{-}e};$$

where $L_{geom}$ is derived from the topology of the capacitor, $L_{attach}$ is loss due to device attachment, $L_{metal}$ is the total metal loss, $L_{sub}$ is the base substrate loss (if present), $L_{rad}$ is the radiation loss, both desired and undesired, $L_{meas}$ is the total loss arising from measurement errors, and $L_{f\text{-}e}$ is the f-e loss tangent.

This loss allocation can first be used to obtain an accurate value of $L_{f\text{-}e}$ (or f-e tan δ) at the desired operating frequency in the manner in which the f-e capacitor will be used. To correctly derive $L_{f\text{-}e}$, one must eliminate or constrain all of the other loss contribution sources just described. For example, $L_{geom}$ will vary according to topology, being best for an overlay capacitor, worse for a gap capacitor, and much worse for an IDC capacitor. Although this loss can be reduced and controlled, it is inherent to a device. Consequently, the choice of topology for a given f-e capacitor will affect the best possible $Q_c$ attainable from the f-e capacitor. Electromagnetic (EM) software can establish a baseline loss for a desired geometry, assuming a lossless f-e film. This baseline loss represents the best (lowest) loss for a given geometry.

In general, a gap capacitor is easiest to fabricate An IDC is next easiest, and an overlay capacitor is hardest of these three. Compared to an IDC, the gap capacitor will have a better Q but lower capacitance per unit cross section (W in FIG. 1a). The IDC's capacitance is greater due to the use of a number of fingers per unit cross section. For many communication filter applications, however, large capacitance (C≧4.0 pF) is not needed. Thus, a gap capacitor often can provide adequate capacitance. The inherently high value of κ for most f-e films helps provide relatively high capacitance per unit cross section, W, compared to a conventional gap capacitor.

$L_{attach}$ arises from discrete device attachment techniques, including, for example, solder, silver paint, or wire bonding. These attachment losses may be large and unpredictable. The lowest losses are achieved by direct fabrication of the f-e capacitor to the resonator or other RF circuitry, thus minimizing if not eliminating this loss component.

The inherent loss of a stand-alone f-e capacitor is of little consequence. What is of much greater consequence is any added loss arising from the attachment of the f-e capacitor to a circuit. Even if the f-e capacitor were lossless, should a large loss connection be used, the overall effect is that of a lossy f-e device. For example, if a Q≧250 at 2.0 GHz is desired for a capacitance of 1.0 pF, then the total series resistance $R_s$ must be ≦0.32 ohm. Any additional loss will thus further reduce the Q of this capacitor. That this additional loss is external to the actual capacitor is irrelevant. Even unavoidable loss mechanisms, such as those due to mounting, for example, lower the effective Q of the capacitor from the perspective of its effect on the system.

For minimum added loss, the connection between the f-e capacitor and the resonator should provide the lowest added resistance. Thus, the electric currents and charges associated with the f-e capacitor should see a minimum added loss. Conventional bonding or mounting techniques, such as (but not limited to) soldering, wire bonding or silver paint or paste do not provide for such a low loss, controllable bond.

The added, unpredictable loss arising from the use of such bonding methods degrade the realized Q regardless of whether or not the f-e capacitor is being used for resonator tuning purposes or characterization of an f-e film. Thus, for best performance (lowest loss) the f-e capacitor structure should be directly fabricated onto or with the resonator it is meant to tune or onto other essential RF circuitry. Only by direct fabrication can there be a minimum loss transition for electromagnetic (EM) sources (currents) from the f-e tuning elements to the resonator. The desirable effects of direct f-e capacitor fabrication onto or with a resonator can be enhanced by the lack of sharp corners or transitions.

Factors for $L_{metal}$ include the surface roughness (SR) of the metal, metal thickness as compared to skin depth, δs, and conductivity. SR may be effectively eliminated as a factor if SR is less than aproximately 10 micro inches root mean square (rms) for operating frequencies in the L and S band (1–4 GHz). The metal thickness may be reduced as a factor if the thickness is 1.5δs or greater, or effectively eliminated if the thickness is ≧5δs. For electrode contacts, metal thickness ($t_m$) can be approximately 1.5δs. For the case of electromagnetic resonators, where a travelling or standing wave must be supported, i.e., where the metal in question extends for an appreciable fraction of a wavelength (about 10% or greater), the metal thickness should be closer to about 5δs or greater.

Conductivity is best for Au, Cu, or Ag. Thus, $L_{metal}$ can be reduced and controlled, but not eliminated as a factor. Its effect, however, can be calculated by expressions well known to those skilled in the art, or by using line calculator tools available in commonly used circuit simulators, such as Eagleware or Touchstone. Further, precise fabrication control can bound geometric variations in $L_{metal}$.

The loss contribution represented by $L_{sub}$ may be minimized by choosing a low loss substrate with a loss tangent less than 0.001 and preferably less than 0.0005 at the operating frequency of interest. Suitable materials include >99% pure alumina, a best current choice for loss/cost benefits. Sapphire or MgO are better than alumina in that they have lower loss tangents, but they are more expensive. All these materials will accept many f-e thin films without buffer layers and have a surface roughness that is acceptable with little or no further polishing. Semiconductor substrates are poor choices because of their relatively high conductivity. In addition to the factors of loss tangent, surface roughness and price, suitable substrates should not be brittle, can be fabricated as larger area wafers, and can be easily metallized without extensive pre-processing.

Separating out Lsub from the total loss of a composite substrate (f-e film plus substrate) can be achieved by using EM field or circuit simulation software. For example, Sonnet, Momentum, or IE3D may be used. Thus, $L_{sub}$ can be reduced significantly and calculated precisely.

$L_{rad}$ can be eliminated by proper shielding and design, and so is typically not a factor. It should be noted that a wide variety of filters, especially planar filters such as combline or hairpin, depend upon radiative coupling to achieve their desired performance. In these cases, one should ensure that the unwanted, stray coupling is reduced, if not eliminated.

$L_{meas}$ can add significantly to the circuit loss error because small, added loss significantly reduces the measured Q of the device-under-test (DUT) or system thus obscuring the intrinsic Q of the DUT. The conventional method for measuring dielectric constant and loss tangent in a material is the cavity perturbation technique, which is well known to anyone skilled in the art. At L-band, however, the size of the cavity becomes quite large. When characterizing thin films (as opposed to bulk) with film thickness ≦1.5 μm, such as f-e films, the problem becomes very difficult as measurement errors can be severe. Furthermore, one should characterize an f-e capacitor (or filter) in a manner most similar to how it will be used. Thus, the preferred way to characterize f-e compounds or films is by microstrip resonator techniques.

For measurements on resonant circuits, a network analyzer is the preferred choice. To minimize measurement loss and attain the most accurate measurement using a network analyzer, loss to DUT should be calibrated out, a full two port calibration of the analyzer should be performed and averaging should be used for calibration and measurement.

Through minimization or elimination of the device attachment, substrate, radiation and measurement error loss components, the total loss becomes:

$$L_{tot}=L_{geom}+L_{metal}+L_{f-e}+\Delta L_{misc} \quad (4)$$

$L_{tot}$ is the total loss for a given ferroelectric capacitor geometry, and $L_{geom}$ and $L_{metal}$ are integral parts of that geometry. Their presence is appropriate for determining the actual loss of a specific device, but they can be quantified and removed in order to determine the loss due solely to the ferroelectric material. $L_{geom}$ can be determined from an accurate electromagnetic simulation of the circuit assuming a lossless ferroelectric material; and $L_{metal}$ can be determined using the expressions for metal loss assuming conductivity, surface roughness (if applicable) and skin depth. $\Delta L_{misc}$ represents a combination of incomplete removal of the other loss mechanisms with the finite bounds on $L_{geom}$ and $L_{metal}$.

This two-step process of (a) accounting for all loss mechanisms; and (b) eliminating or bounding these losses not only permits an accurate determination of the ferroelectric loss, it also helps establish correct design guidelines for low loss tunable components. Correct knowledge of $L_{f-e}$ allows one to first determine whether or not the film under consideration can be used for a proposed application. Knowledge of $L_{f-e}$ further provides a necessary baseline for any type of optimum design using ferroelectric films. This knowledge is necessary if one is to effectively trade-off loss tangent for tunability. In short, accurate fabrication and measurement techniques result in consistent ferroelectric film loss characterization.

Based on this loss analysis, low loss tunable ferroelectric components, and in particular tunable ferroelectric capacitors, can be designed, tested and implemented in a wide variety of applications. Design procedure and implementation based on this loss analysis for three common types of capacitors—(1) gap capacitors, (2) overlay capacitors and (3) interdigital capacitors—will now be discussed.

Figure 2:
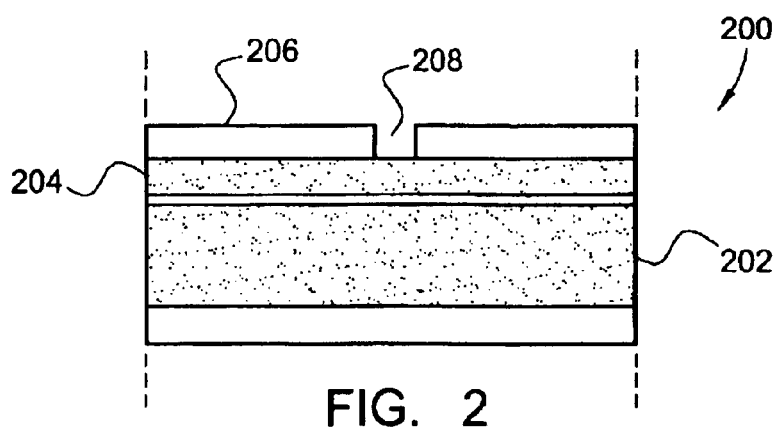
FIG. 2 is a sectional view of a tunable ferroelectric gap capacitor according to the present invention.

A ferroelectric tunable gap capacitor 200 is illustrated in FIG. 2. Gap capacitor 200 comprises substrate layer 202; ferroelectric layer 204 and metal layer 206 defining capacitance-inducing gap 208. The following design implementation minimizes losses from other sources and permits an accurate determination of the loss due to the ferroelectric film 204. It assumes an operating frequency in the L-band (1–2 GHz) for wireless handsets, though the same methods could be applied in other bands.

In one implementation, substrate 202 is a layer of 99.5% pure alumina having a thickness in the range of 20–40 mils. Surface roughness should be less than or equal to about 5 $\mu$inch rms. Ferroelectric layer 204 is a film of barium strontium titanate, $Ba_xSr_{1-x}TiO_3$, (BSTO) having a thickness in the range of 0.15 to 2.0 microns. Using a film thickness >1.0 $\mu$m maximizes capacitance and tuning range.

Adjusting the Ba/Sr fraction, doping or annealing are preferably chosen to provide the minimum tan δ while providing the required tuning range. In one embodiment, x=0.5 (in $Ba_xSr_{1-x}TiO_3$) for room temperature operation. Alternative ferroelectric materials could also be used. Metal layer 206 has a thickness of approximately 2.5 $\mu$m, which makes it suitable for electrode application. Gap 208 is 30–80 mils wide, and the edges should be rounded to maximize loss reduction. The capacitance demonstrated by gap 208 is in the range of 0.6 pF to 1.5 pF at 0 volts DC bias.

Figure 3:
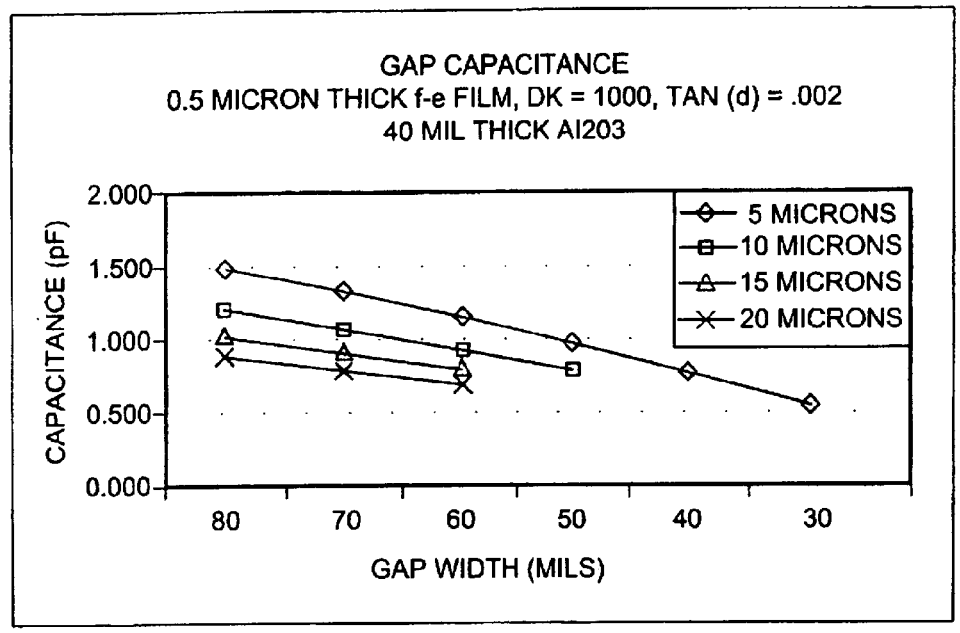
FIG. 3 is a table showing the relationship between gap width, ferroelectric layer thickness and capacitance.

EM simulations indicate that for a capacitance of approximately one pF at two GHz, a gap capacitor has $Q \geq 700$, assuming a loss tangent of 0.002, or Q>300, assuming a loss tangent of 0.005. FIG. 3 is a table showing the relationship between gap width, ferroelectric layer thickness and capacitance. This data is very useful for target design of gap capacitor test circuits. The results in FIG. 3 assume a 0.5 micron thick ferroelectric film with a dielectric constant of 1000 at 0V DC bias, a 40 mil thick substrate layer of 99.5% pure alumina, and a loss tangent of 0.002 for the f-e film.

Figure 4:
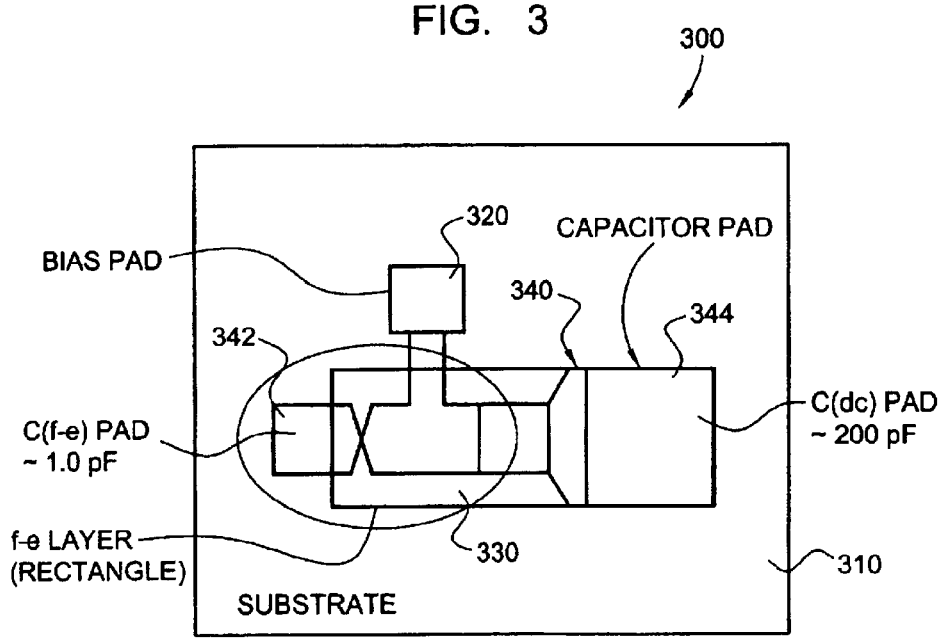
FIG. 4 is a top view of a ferroelectric overlay capacitor according to the present invention.

A ferroelectric overlay capacitor 300 according to the present invention is illustrated in FIG. 4. Capacitor 300 comprises substrate 310; bias pad layer 320; ferroelectric layer 330; and capacitor pad layer 340. Bias pad layer 320 defines a DC bias pad and capacitor pad 340 defines capacitor pad 342 and DC blocking capacitor pad 344.

In one implementation, base substrate 310 is alumina having a thickness in the range of 20–40 mils. Bias pad layer 320 comprises a base electrode layer of silver having a thickness of approximately 2.0 microns covered by a layer of platinum having a thickness of approximately 100 nm. The platinum layer prevents the silver layer from oxidizing during growth of the ferroelectric layer. Layer 320 has a pad built-in for connecting a resistance in the range of 0.5 to 1.0 MΩ to provide DC bias. If needed, a thin (10 nm) chromium layer may be interposed between the alumina and silver to provide better adhesion. Ferroelectric layer 330 is a thin film of BSTO having a thickness of approximately one micron. Capacitor pad 342 has a minimum area of 8.0 by 4.0 mils and is topped by electrodes of gold or silver that have an area of approximately 4.0 by 4.0 mils. The DC blocking capacitor has a capacitance of at least 150–200 pF and an area of approximately 100 by 100 microns. The total area of contact pad 344 is a minimum of 7.0 by 8.0 mils.

Figure 5:
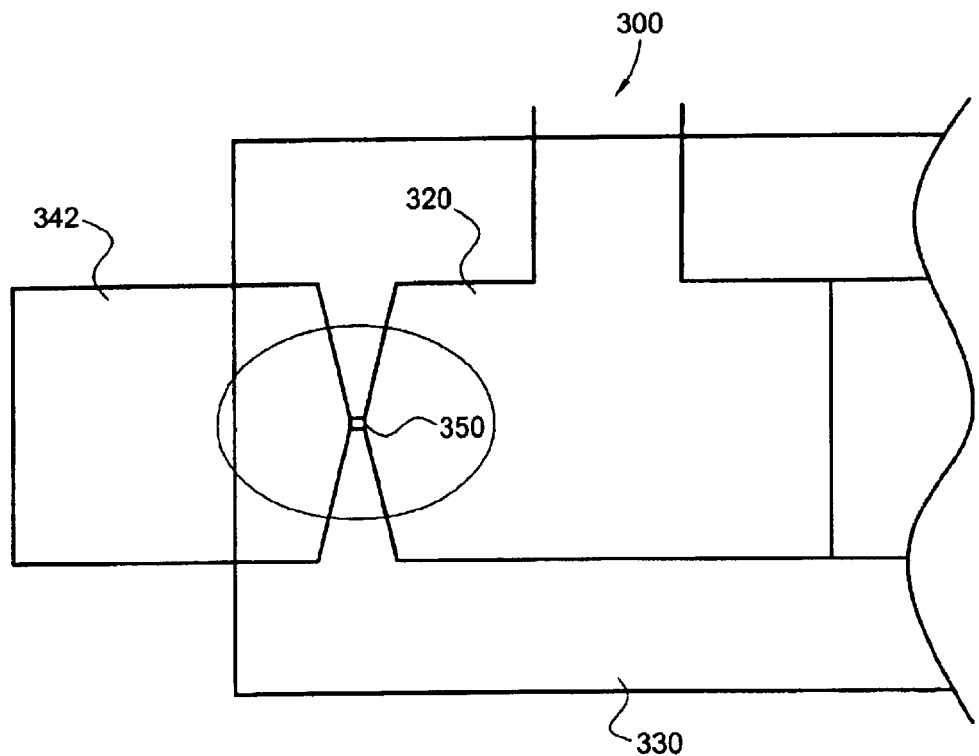
FIG. 5 is an exploded view of a portion of the overlay capacitor of FIG. 4.

An overlay capacitor has a minimum capacitance in the range of 0.8–1.5 pF. As can be seen in FIG. 5, which is an enlargement of a portion of capacitor 300, the overlap area 350 of capacitor 300 is very small. In one implementation, overlap area 350 has a size of 0.3 mil by 0.3 mil. This is based on a BSTO dielectric constant of about 1000 at 0 volts DC and a film thickness of about 1.0 microns. The pads 342 and 320 taper to and from capacitor overlay area 350. The taper is from 4.0 mils to about 0.25 mils in 1.0 mil distance.

The loss target for capacitor 300 is a Q of at least 350 at 2.0 GHz for 1.0 pF. If needed, the ferroelectric film 330 can be further optimized via doping, annealing or use of a buffer layer or layers. Finally, the change in capacitance should preferably be 2:1 (50%) or greater for a change in bias voltage of 0–2.5 volts.

One aspect of the present invention is optimal structures and design criteria for tunable ferroelectric components, of which the capacitor structures described above are one example. Another aspect of the present invention is measurement methods and apparatus for accurately characterizing the losses in tunable ferroelectric components. These methods involve the use of resonators and narrowband resonant circuits. Narrowband measurements are appropriate since the devices being measured are designed to operate at a narrowband of frequencies. Narrowband (resonant) measurements are also preferred as the naturally enhance the effect of small losses making them easier to measure, and they make the measurement more accurate. Prior methods have involved broadband measurements that are inappropriate and inaccurate for narrowband devices. Two inventive implementations of these testing resonant circuits will be described: second order narrowband bandpass filters, and microstrip resonator circuits (halfwave or quarterwave).

Figure 6:
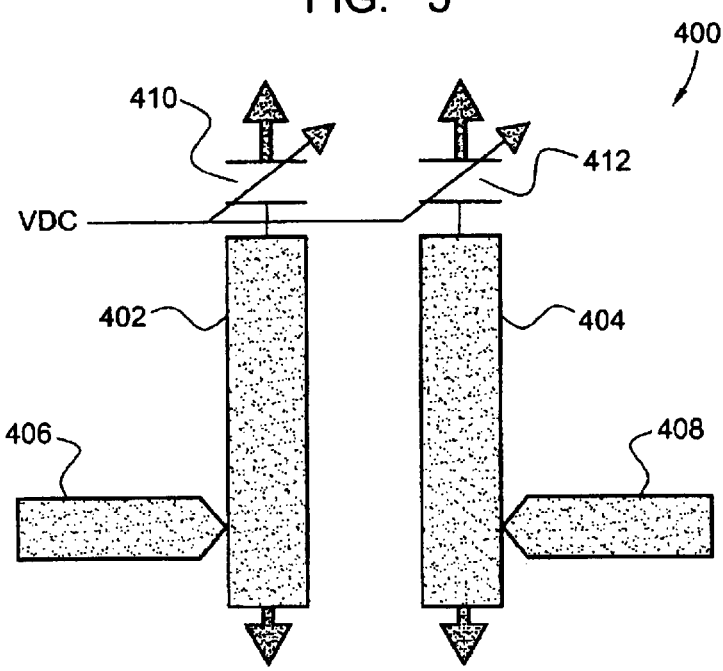
FIG. 6 is a second order narrowband resonant testing circuit according to the present invention.

FIG. 6 shows a resonant narrowband testing circuit 400 configured to test two ferroelectric capacitors 410 and 412. It is a $2^{nd}$ order planar combline filter. Capacitors 410 and 412 are configured as described with respect to FIG. 1 and FIG. 2 and are implemented to minimize loss components. Testing circuit 400 comprises a planar, second order combline bandpass filter and includes two resonators 402 and 404 coupled in series with, respectively, ferroelectric capacitors 410 and 412. A DC bias voltage is applied to capacitors 410 and 412. Capacitors 410 and 412 may be fabricated and mounted for testing either as lumped elements or by printing directly on the substrate. DC blocking capacitors (capacitance equal to about 180 pF) are not shown. In a lumped configuration, the capacitors are soldered or attached with silver paint or paste. This permits use of a wide variety of devices, however, there is an increased and unpredictable loss due to this mounting method. In a printed configuration, the capacitors are printed directly on the substrate. Printing is advantageous in that no soldering or bonding is required and there is a lower loss due to the direct fabrication. The type of substrates that may be used is limited, however, due to the presence of the ferroelectric film. DC blocking capacitors are not shown.

The response is measured through input and output lines 406 and 408 connected to a network analyzer. A measurement of the resonator center frequency $f_0$ permits determination of the actual capacitor value (see equation (1), above), and the insertion loss at $f_0$ determines the capacitor Q. After these measurements are obtained, a circuit simulation can be used to obtain capacitance and Q values and the results compared.

Figures 7, 8:
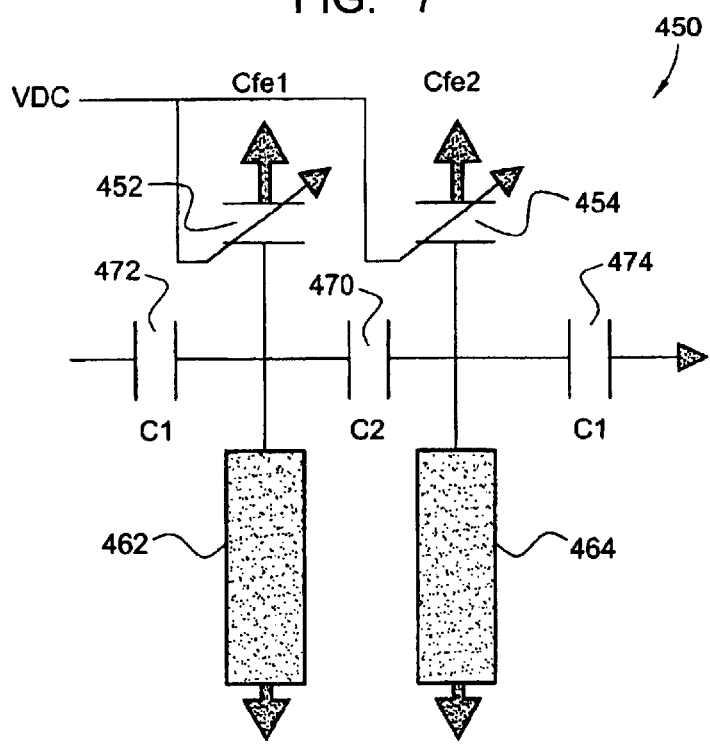
FIG. 7 is a table comparing data obtained with the testing circuit of FIG. 6 with data obtained using conventional test methods.
FIG. 8 is another embodiment of a second order narrowband resonant testing circuit according to the present invention.

In order to demonstrate the dramatic difference in test results obtained using the test method of the present invention relative to conventional test methods, reference is made to FIG. 7. The table in FIG. 7 presents measurement data obtained from ferroelectric interdigital capacitor samples fabricated at the Naval Research Laboratory (NRL), Washington D.C., under contract to Kyocera Wireless Corporation (KWC), the assignee of the present invention. Capacitance and Q measurements taken from the interdigital capacitor samples at NRL using conventional test methods (in this case, an HP 4291B Impedance Analyzer and a Cascade Tech microwave probe) are compared to measurements taken from the same samples at KWC using the novel test methods described above.

For purposes of this experiment, the interdigital capacitors were fabricated to have a capacitance in the range of 0.5–1.2 pF; a gap spacing of approximately 5.0 microns; a finger width of at least 150 microns; a ferroelectric film thickness of approximately 0.5 microns; a metal thickness in the range of 1.5–2.5 microns; and a finger length less than or equal to 100 microns.

The KWC testing circuit is configured in like fashion as circuit 400. It is a second order planar Chebychev bandpass filter configured to resonate at approximately 1800 MHz. The interdigital capacitor samples, lumped element capacitors, were "flip-chip" mounted and attached using silver paint. Bias was applied to correct for the fact that typically C1≠C2, where C1 and C2 are the two combline bandpass filter loading capacitors required for correct operation of the filter. While C1 is intended to be equal to C2, in practice C1=C2 is rarely achieved. The more common condition of C1≠C2 significantly increases passband insertion loss (as far as Q determination is concerned) if not corrected.

High Q ATC and AVX chip capacitors in the range of 0.6 to 0.8 pF were used to establish a baseline passband insertion loss. The Q's for these chip capacitors were in the range of 600–800 at the test frequency. An Eagleware circuit simulator was used to determine actual capacitance and Q's for the interdigital capacitors to give the same resonant frequency and passband insertion loss as the measured data.

The data in FIG. 7 is essentially worst case Q data, as no attempt was made to remove (calibrate out) all possible loss components. One such loss component includes bonding (attachment) losses which are different for each line and interdigital capacitor. Another is the resulting resonator length mismatch; microstrip gap open end effects below the location of the capacitors; and losses arising from the basic interdigital capacitor geometry. This being the case, the difference in Q values obtained using the present invention relative to conventional methods is even more striking. Further reduction or elimination of error sources such as, for example, the direct fabrication of gap capacitors using an alumina or MgO substrate will only improve the Q data.

Use of a second order bandpass filter as the narrowband resonant test circuit has several advantages. Capacitor data can be extracted at the operating frequency. The topology is simple, repeatable and easily fabricated. The measurements are simple and there is little added error by virtue of taking the measurements. The results are easy to compare to the simulated results. There are also several disadvantages that should be noted. The potential for difference in capacitance values described above may show up in the measurement data as increased loss. A small adjustment in one of the bias voltages, however, can compensate for this discrepancy. Also, stray capacitance and coupling can effect the $f_0$ and Q values obtained. These effects can also be accounted for via the EM field simulator. Unequal mounting of f-e capacitors results in slight differences in the two resonator electrical lengths, which directly adds to I.L. Misalignment of the f-e caps can also result in added loss, manifesting itself as lower Q.

Another embodiment of a second order narrowband resonant testing circuit 450 is depicted in FIG. 8. Testing circuit 450 takes the form of a coaxial resonator tunable filter although other resonators, such as monoblock, stripline or microstrip can be used. Again, ferroelectric capacitors 452 and 454 may be lumped or printed. Test circuit 450 further comprises coaxial quarter wavelength resonators 462 and 464. Non-ferroelectric capacitor 470 (C2) is coupled between resonators 462 and 464, and non-ferroelectric capacitors 472 and 474 (C1) are coupled on the outsides of the resonators. This basic structure is a conventional fix-tuned $2^{nd}$ order top capacitively coupled BPF.

The measurement technique using circuit 450 is as follows. BPF performance is measured first without, then with f-e capacitors in place. In the first instance, the resonator center frequency $f_{01}$ and the insertion loss $IL_1$ of the filter is first measured without ferroelectric capacitors. In the second instance, the resonator center frequency $f_{02}$ and insertion loss $IL_2$ of the filter are measured with ferroelectric capacitors 452 and 454. Notably, $f_{01}$ will always be greater than $f_{02}$ and $IL_2$ will always be greater than $IL_1$ as long as resonators 442 and 444 are the same length. The capacitance $C_{fe}$ can be determined from $f_{01}-f_{02}$, and $Q(C_{fe})$ can be determined from $IL_2-IL_1$ by comparison with simulations to great accuracy. The f-e capacitors need not be added to the original circuit. Rather, the basic top capacitively coupled BPF can be fabricated with no f-e capacitors, and a second BPF fabricated with f-e capacitors directly. This would lead to a minimum-added-loss tunable test circuit as it allows for direct fabrication of f-e capacitors with the circuit.

An alternative testing circuit would involve the use of physically shorter resonators 442 and 444 when used in conjunction with f-e capacitors. This would cause the BPF to resonate at or near the same resonant frequency as the non f-e BPF. The same f-e capacitor Q extraction method would be used.

Second order test circuit 450 has several advantages over second order test circuit 400. Both circuit 400 and circuit 450 are inherently narrowband structures but the coaxial resonators 462 and 464 can have a very high Q, resulting in a very low insertion loss. Very little stray coupling is involved due to the inherent shielding. Also, as with circuit 400, test circuit 450 is not only a test circuit but could be used as a bandpass filter in real world applications. However, circuit 450 is a little harder to fabricate and test. Fixturing is critical and adding the ferroelectric capacitors results in extra losses due to mounting. This can be overcome via direct fabrication of the ferroelectric capacitors on the same circuit used to realize C1 and C2, and then having an additional circuit without the ferroelectric capacitors.

The testing circuit and method can be further simplified by using a single resonator rather than two. This eliminates the problem of capacitor mismatch. The resulting circuit is more robust, easier to model and less prone to errors. Note that though the results shown in FIG. 7, are the results of tests on interdigital capacitors, gap or overlay capacitors can be advantageously used, since they both can have higher Q's than interdigital capacitors.

Figure 9:
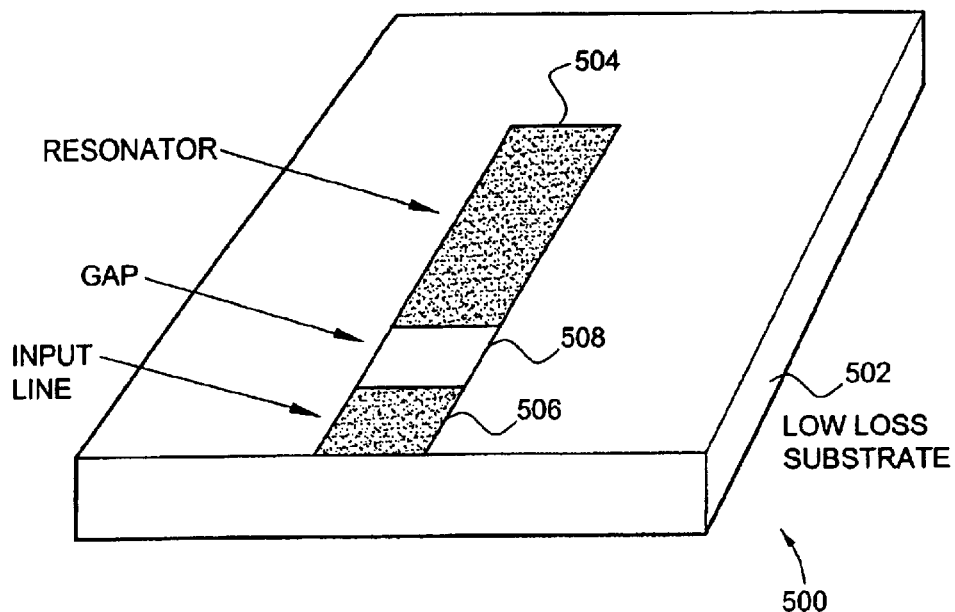
FIG. 9 is a single resonator narrowband testing circuit according to the present invention.

A testing circuit 500 comprising a gap coupled microstrip resonator in its simplest form is depicted in FIG. 9. Circuit 500 comprises a low loss substrate 502, and a microstrip resonator 504 separated from input line 506 by a gap 508. A ferroelectric thin film is deposited in gap 508 to create the ferroelectric gap capacitor. Hence, resonator 604 and the gap capacitor are fabricated as a single, integrated structure. Alternatively, a ferroelectric material can be deposited underneath the resonator 504, creating a tunable resonator.

Substrate 502 should be a high quality, low loss substrate such as magnesium oxide, alumina having a purity of greater than 99% and sapphire. Substrate 502 should also have a low S.R. (less than 5.0 μinch). Resonator 504 can be either a half wavelength (open circuit) or quarter wavelength (short circuit) resonator. A half wavelength resonator is longer but easier to fabricate, while a quarter wavelength resonator is shorter but requires via. The width of gap 508 is chosen for near critical-coupling.

A network analyzer is preferably used for the capacitance and Q measurements. The model for gap capacitance and expression for metal loss are used to extract the Q of the dielectric, which is now a composite of the Q of the base substrate and the Q of the ferroelectric thin film. Hence, the added loss over that of the base substrate represents the loss of the ferroelectric film. Finally, proper analysis of the measured data, such as that outlined in "Data Reduction Method for Q Measurements of Strip-Line Resonators," IEEE Transactions in MTT, S. Toncich and R. E. Collin, Vol. 40, No. 9, September 1992, pp. 1833–1836, hereby incorporated by reference, is required to accurately extract the Q, or loss, of the capacitor under test.

It is useful now to compare the second order narrowband resonant test methods and circuits described with reference to FIGS. 6–8 with the gap coupled single resonator test method and circuit described with reference to FIG. 9. The gap coupled single resonator is advantageous in that is small, simple and very easy to fabricate. It also requires no tuning for any possible mismatch of the input and output capacitors C1. However, it is more difficult to extract the ferroelectric loss tangent from the overall substrate and coupling capacitor loss. The second order resonant circuits, on the other hand, can be actual devices in addition to being testing circuits. Moreover, it is very easy to compare the measured data to either simulation data or data obtained using non-ferroelectric capacitors with high Qs. The drawbacks of the second order circuits and more tuning of the larger, more complex circuits and more tuning of the ferroelectric capacitors may be required to obtain minimum insertion loss.

Figure 10A:
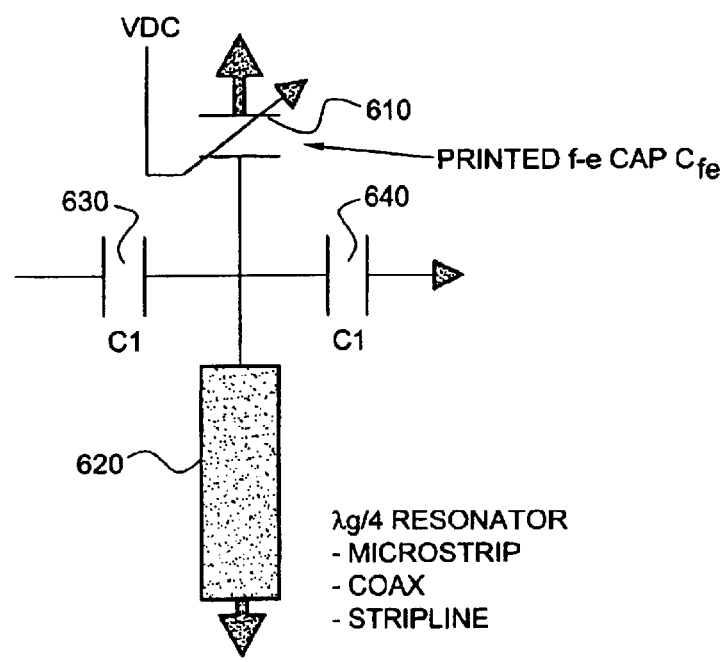
FIG. 10a is a schematic of another embodiment of a single resonator narrowband testing circuit according to the present invention.
Figure 10B:
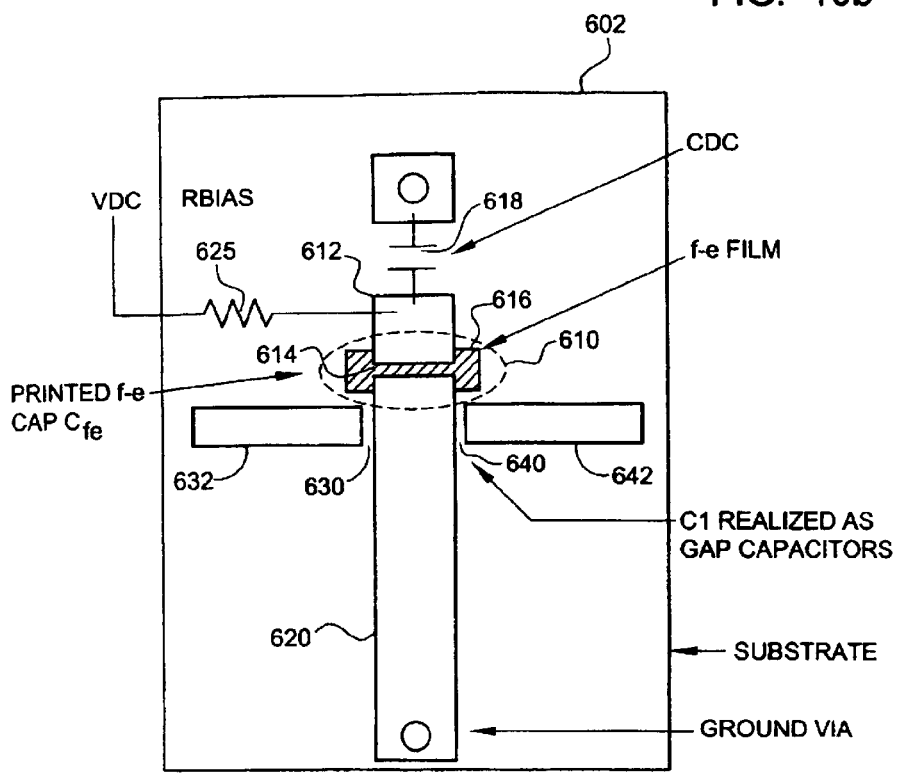

FIGS. 10a and 10b depict a preferred narrowband resonant testing circuit 600. Circuit 600 takes the form of a single resonator bandpass filter. Referring to FIG. 10a, which is a schematic of circuit 600, circuit 600 comprises ferrolectric capacitor 16 coupled to resonator 620. Capacitors 630 and 640 (C1) are input and output capacitors connecting the resonators to the measurement instrument.

FIG. 10b is a planar realization of circuit 600. As can be seen, capacitor 610 and resonator 620 are fabricated as an integrated component. Ferroelectric film 616 is deposited on low loss substrate 602. Resonator 620 and conductive path 612 are separated by gap 614 over ferroelectric film 616 to define ferroelectric gap capacitor 610. A DC bias voltage is applied to pad 612 and may include a bias resistor 625. DC blocking capacitor 618 is connected between pad 612 and ground. Capacitors 630 and 640 are realized by conductive strips 632 and 642 deposited on substrate 602 that are spaced from resonator 620 to form a capacitive gap.

In one implementation, substrate 602 is formed from 99.5% pure alumina and has a thickness of approximately 40 mils and an SR of approximately 5.0 μinch. Ferroelectric film 616 has a thickness of approximately 1.0 μm and is deposited in the region of gap capacitor 610 only. Microstrips 612 and 620 have a thickness of 4–6 μm and are spaced by approximately 10 μm to define gap 614. The length of resonator 620 is selected so that the overall structure (capacitor 610 and resonator 620) resonates in the desired frequency band. In one implementation, resonator 620 is a quarter wave resonator. Further fabrication cycles can be used to fine tune the resonant frequency if a specific resonant frequency is desired or required.

Resonator 620 may be configured as a microstrip, coaxial or stripline resonator. A planar microstrip configuration is preferred as it facilitates easier extraction of the capacitance and Q values from circuit 600. The use of an integrated component structure (i.e., a resonator having an integrated gap capacitor, such as resonator 620/capacitor 610) is advantageous relative to the use of a separate resonator and a lumped element capacitor as the unpredictable and hard to measure losses and errors introduced by a lumped element capacitor are eliminated.

A testing method using a single resonator bandpass testing circuit, such as circuit 600, proceeds as follows. First, a single resonator bandpass filter test circuit having an integrated gap capacitor is fabricated as described above. Precise thin film fabrication and processing techniques should be used to ensure that the desired geometry and properties are attained. Preferably, a technique should be used with tolerances in the range of ±0.5 microns. Once the circuit is fabricated, the center frequency $f_0$ and insertion loss $IL_0$ are measured. Preferably, these measurements are obtained using a network analyzer calibrated by means of a full two port calibration and using averaging.

Next, the same circuit is designed and analyzed on an electromagnetic field simulation tool such as Sonnet, IE3D or Momentum. Initially, the simulation assumes no loss due to the ferroelectric film (i.e., a loss tangent of zero). The ferroelectric dielectric constant is then adjusted in the gap region to give the same center frequency $f_0$ as measured in the test circuit. $IL_0$ is then calculated for the ferroelectric gap capacitor alone. This value is then used in the simulation to account for the loss component $L_{metal}$ associated with the metal.

Next, another circuit simulation is run, but this time using a non-zero loss tangent. In one implementation, a loss tangent of 0.003 is used and $IL_0$ is recalculated. This iterative process is continued until the measured insertion loss $IL_0$ from the test circuit is obtained, thereby yielding a very accurate approximation of the loss tangent for the circuit, as well as the loss component $L_{geom}$ due to the particular structure being tested (in this case, a gap capacitor).

The baseline performance of the SR-BPF can be established by fabrication of the circuit with no f-e film. The resulting resonant frequency will of course be higher as the loading capacitor 610 is smaller. This result will provide accurate information on overall shape and frequency response of the SR-BPF.

Circuit 600 is not only an accurate mechanism for measuring the loss introduced by a ferroelectric gap capacitor, it is also a basic building block for low loss tunable filters that may be implemented in a wide range of applications, such as wireless handsets. Narrowband resonant circuits configured as taught herein can be used to enhance the efficiency of, and add tunability to, many components of a typical RF transceiver. Examples of RF components in which the present invention could be implemented include, but are not limited to, duplexers, isolators, matching circuits, power amplifiers, multiplexers, bandpass filters and low noise amplifiers. With each element being tunable, it becomes unnecessary to use multiple circuitry blocks to accommodate multi-band modes. If necessary, the resonant circuits can be cascaded in an appropriate fashion to create desired filters and systems, vastly improving system performance while decreasing cost and size. Many of the components of a typical wireless handset would benefit from tunability.

The description and drawings contained herein are particular embodiments of the invention and are representative of the subject matter broadly contemplated by the invention. However, the invention encompasses other embodiments that will be obvious to those skilled in the art. Accordingly, the scope of the invention is limited only by the appended claims.

What is claimed is:

1. A tunable ferroelectric capacitor comprising:
    a first conducting surface;
    a second conducting surface, the first and second conducting surfaces comprising a capacitive component;
    a ferroelectric material proximate the first and second conducting surfaces; and
    a variable voltage line coupled to the ferroelectric material for changing a capacitance of the capacitive component, responsive to a changing dielectric constant of the ferroelectric material, responsive to a voltage applied to the variable voltage line;
    wherein a Q of the tunable ferroelectric capacitor, when operated in a temperature range between about −50 degrees Celsius and 100 degrees Celsius, is greater than about 80 in a frequency range between 0.25 GHz and 7.0 GHz.

2. A tunable ferroelectric capacitor as in claim 1, wherein the quality factor, when operated in a temperature range between about −50 degrees Celsius and 100 degrees Celsius, is greater than about 80 in a frequency range between about 0.8 GHz and 7.0 GHz.

3. A tunable ferroelectric capacitor as in claim 1, wherein the quality factor, when operated in a temperature range between about −50 degrees Celsius and 100 degrees Celsius, is greater than about 80 in a frequency range between about 0.25 GHz and 2.5 GHz.

4. A tunable ferroelectric capacitor as in claim 1, wherein the quality factor, when operated in a temperature range between about −50 degrees Celsius and 100 degrees Celsius, is greater than about 80 in a frequency range between about 0.8 GHz and 2.5 GHz.

5. A tunable ferroelectric capacitor as in claim 1, wherein the quality factor, when operated in a temperature range between about −50 degrees Celsius and 100 degrees Celsius, is greater than about 180 in a frequency range between 0.25 GHz and 7.0 GHz.

6. A tunable ferroelectric capacitor as in claim 1, wherein the quality factor, when operated in a temperature range between about −50 degrees Celsius and 100 degrees Celsius, is greater than about 180 in a frequency range between about 0.8 GHz and 2.5 GHz.

7. A tunable ferroelectric capacitor as in claim 1, wherein the quality factor, when operated in a temperature range between about −50 degrees Celsius and 100 degrees Celsius, is greater than about 80 for a capacitance in a range between about 0.3 pF and 3.0 pF.

8. A tunable ferroelectric capacitor as in claim 1, wherein the quality factor, when operated in a temperature range between about −50 degrees Celsius and 100 degrees Celsius, is greater than about 80 for a capacitance in a range between about 0.5 pF and 1.0 pF.

9. A tunable ferroelectric capacitor as in claim 1, wherein the quality factor, when operated in a temperature range between about −50 degrees Celsius and 100 degrees Celsius, is greater than about 180 for a capacitance in a range between about 0.3 pF and 3.0 pF.

10. A tunable ferroelectric capacitor as in claim 1, wherein the quality factor, when operated in a temperature range between about −50 degrees Celsius and 100 degrees Celsius, is greater than about 180 for a capacitance in a range between about 0.5 pF and 1.0 pF.

11. A tunable ferroelectric capacitor as claimed in claim 1, wherein the capacitor has a capacitance of about 0.8 to 1.5 pF when zero voltage is applied to the ferroelectric material.

12. A tunable ferroelectric capacitor as claimed in claim 1, wherein the ferroelectric material comprises barium strontium titanate.

13. A tunable ferroelectric capacitor as claimed in claim 1, wherein the ferroelectric material comprises a film having a thickness of approximately one micron.

14. A tunable ferroelectric capacitor as claimed in claim 1, wherein the capacitor is a microstrip gap capacitor.

15. A tunable ferroelectric capacitor as claimed in claim 1, wherein the first conducting surface and the second conducting surface are separated by a gap approximately 2.5 microns wide.

16. A tunable ferroelectric capacitor as claimed in claim 1, wherein the conductors are metal strips having a thickness in the range of 2–3 microns.

17. A tunable ferroelectric capacitor as claimed in claim 1, wherein the capacitor is an overlay capacitor.

18. A tunable ferroelectric capacitor as claimed in claim 1, wherein the second conducting surface comprises either gold or silver.

19. A tunable ferroelectric capacitor as claimed in claim 1, wherein:
    a first taper to the tunable ferroelectric capacitor from a ferroelectric capacitor bond pad comprises a contraction of the first conducting surface from about 4.0 mils wide to about 0.1 mils wide over a distance of about 1.0 mils; and
    a second taper from the tunable ferroelectric capacitor to a DC bias pad region comprises an expansion of the second conducting surface from about 0.1 mils wide to about 4.0 mils wide over a distance of about 1.0 mils.

* * * * *